(12) United States Patent
Han et al.

(10) Patent No.: US 10,887,115 B2
(45) Date of Patent: Jan. 5, 2021

(54) POWER CONTROL METHOD FOR POWER OVER DATA LINE SYSTEM

(71) Applicant: HYUNDAI MOTOR COMPANY, Seoul (KR)

(72) Inventors: Jeong Seok Han, Suwon-si (KR); Dong Ok Kim, Goyang-si (KR); Jin Hwa Yun, Seoul (KR)

(73) Assignee: Hyundai Motor Company, Seoul (KR)

( * ) Notice: Subject to any disclaimer, the term of this patent is extended or adjusted under 35 U.S.C. 154(b) by 391 days.

(21) Appl. No.: 15/462,011

(22) Filed: Mar. 17, 2017

(65) Prior Publication Data

US 2017/0272260 A1    Sep. 21, 2017

(30) Foreign Application Priority Data

Mar. 17, 2016    (KR) .................. 10-2016-0032366

(51) Int. Cl.
*H02J 4/00* (2006.01)
*H04L 12/10* (2006.01)
*G01R 19/165* (2006.01)
*H04L 29/08* (2006.01)

(52) U.S. Cl.
CPC ............ *H04L 12/10* (2013.01); *G01R 19/165* (2013.01); *H02J 4/00* (2013.01); *H04L 67/12* (2013.01)

(58) Field of Classification Search
CPC ........... H04L 12/10; H02J 4/00; G01R 19/165

USPC ............................................................ 307/1
See application file for complete search history.

(56) References Cited

U.S. PATENT DOCUMENTS

| | | | |
|---|---|---|---|
| 9,377,794 B1 * | 6/2016 | Dwelley | H04L 41/0681 |
| 9,535,437 B1 * | 1/2017 | Dwelley | H04L 41/0681 |
| 2013/0264888 A1 * | 10/2013 | Sako | H04B 5/0037 |
| | | | 307/104 |
| 2015/0091391 A1 * | 4/2015 | Dwelley | H02J 3/00 |
| | | | 307/130 |
| 2016/0156173 A1 * | 6/2016 | Gardner | H02H 3/202 |
| | | | 361/91.5 |
| 2017/0311419 A1 * | 10/2017 | Wendt | H02J 1/14 |

* cited by examiner

*Primary Examiner* — Rexford N Barnie
*Assistant Examiner* — Swarna N Chowdhuri
(74) *Attorney, Agent, or Firm* — Morgan, Lewis & Bockius LLP

(57) ABSTRACT

Disclosed are power supply methods in a power over data lines (PoDL) system for a vehicle network. An operation method of a power sourcing equipment (PSE) for power supply to a powered device (PD) comprises measuring an input voltage applied to the PSE; detecting a low voltage state in which the input voltage is lower than a low voltage detection reference voltage; determining whether the low voltage state is a transient voltage drop state; and entering a settle-sleep step when the low voltage state is not the transient voltage drop state, and stopping the power supply between the PSE and the PD while maintaining a link between the PSE and the PD when the low voltage state is the transient voltage drop state.

19 Claims, 9 Drawing Sheets

POWER CONTROL METHOD FOR POWER OVER DATA LINE SYSTEM

CROSS-REFERENCE TO RELATED APPLICATIONS

This application claims the benefit of and priority to Korean Patent Application No. 10-2016-0032366, filed on Mar. 17, 2016 in the Korean Intellectual Property Office (KIPO), the entirety of which is incorporated by reference as if fully set forth herein.

TECHNICAL FIELD

The present disclosure relates to power control methods for a power of data lines (PoDL) system, and more specifically, to methods for power supply through the PoDL system under unstable power conditions occurring in a vehicle.

BACKGROUND

Electronic devices installed in a vehicle have been increased significantly in their number and variety along with recent digitalization of vehicle parts. Generally, electronic devices may be used throughout the vehicle, such as in a power train control system (e.g., an engine control system, an automatic transmission control system, or the like), a body control system (e.g., a body electronic equipment control system, a convenience apparatus control system, a lamp control system, or the like), a chassis control system (e.g., a steering apparatus control system, a brake control system, a suspension control system, or the like), a vehicle network (e.g., a controller area network (CAN), a FlexRay-based network, a media oriented system transport (MOST)-based network, or the like), a multimedia system (e.g., a navigation apparatus system, a telematics system, an infotainment system, or the like), and so forth.

The electronic devices used in each of these systems are connected via the vehicle network, which supports functions of the electronic devices. For instance, the CAN may support a transmission rate of up to 1 Mbps and support automatic retransmission of colliding messages, error detection based on a cycle redundancy interface (CRC), or the like. The FlexRay-based network may support a transmission rate of up to 10 Mbps and support simultaneous transmission of data through two channels, synchronous data transmission, or the like. The MOST-based network is a communication network for high-quality multimedia, which may support a transmission rate of up to 150 Mbps.

Meanwhile, the telematics system and the infotainment system, like most enhanced safety systems of a vehicle do, require higher transmission rates and system expandability. However, the CAN, FlexRay-based network, and the like may not sufficiently support such requirements. The MOST-based network, in particular, may support a higher transmission rate than the CAN or the FlexRay-based network. However, applying the MOST-based network to vehicle networks can be costly. Due to these limitations, an Ethernet-based network is often utilized as a vehicle network. The Ethernet-based network may support bi-directional communication through one pair of windings and may support a transmission rate of up to 10 Gbps. The Ethernet-based vehicle network may include a plurality of communication nodes. The communication node may be a gateway, a switch (or bridge), an end node, or the like.

Control of a power supply in a PoDL system is handled by a power sourcing equipment (PSE) through a power interface (PI). In this case, the PSE senses a voltage and current, judges whether a link segment is short-circuited or open when the sensed voltage or current exceeds a predetermined reference value, and stops the power supply by lowering the PSE voltage when the link segment is judged to be opened. However, due to characteristics of vehicle power conditions, a voltage applied to the PSE may fluctuate unstably. For example, when the voltage supplied to the PSE is temporarily lowered remarkably at the time of ignition or output of a bass speaker (woofer), connection of the PoDL system may also be turned off. Also, for example, when the battery of the vehicle is in the OFF state, if a charged electric device is connected to, for example, a cigar jack terminal of the vehicle, a reverse voltage may be supplied to an internal circuit of the vehicle from the charged electric device connected through the cigar jack line, whereby the voltage inside the vehicle rises abruptly and the PSE may be damaged.

Generally, abnormal voltage and current, flowing into power lines, communication lines and signal lines of all power systems, are collectively referred to as 'surge'. For example, in regards to a computer system operated by a DC 50 V or less power supply, surge of 50 V or more may cause damages to electronic devices in the computer system, such as functional deterioration of the electronic devices, and the like.

SUMMARY

The present disclosure provides methods to maintain or stop a power supply through PoDL for proper power supply, preventing unconditional power stop or maintenance of the power supply to PoDL against unstable input voltage that may occur in a vehicle, by monitoring an input voltage of a PSE.

In accordance with embodiments of the present disclosure, an operation method of a power sourcing equipment (PSE) for power supply to a powered device (PD) in a power over data lines (PoDL) system for a vehicle network in a vehicle may be provided. The method may comprise measuring an input voltage applied to the PSE; detecting a low voltage state in which the input voltage is lower than a low voltage detection reference voltage; determining whether the low voltage state is a transient voltage drop state; and entering a settle-sleep step when the low voltage state is not the transient voltage drop state, and stopping the power supply between the PSE and the PD while maintaining a link between the PSE and the PD when the low voltage state is the transient voltage drop state.

The stopping the power supply may include re-measuring the input voltage applied to the PSE after a predetermined reference time elapses; and entering the settle-sleep state when the re-measured input voltage is lower than the low voltage detection reference voltage, and resuming the power supply between the PSE and the PD when the re-measured input voltage is higher than the low voltage detection reference voltage.

The detected low voltage state may be accumulated when the low voltage state is detected.

The data in the detected low voltage state may include the input voltage applied to the PSE.

The data in the detected low voltage state may include an input current corresponding to the input voltage applied to the PSE.

The data in the detected low voltage state may include time information of the vehicle network or duration information of the low voltage state.

The low voltage detection reference voltage may be a low voltage threshold value of a battery installed in the vehicle.

The method may further comprise recording a number of detections of the low voltage state when the low voltage state is detected; and determining that a voltage of a battery installed in the vehicle is inadequate when the number of detections of the low voltage state exceeds a predetermined reference number.

The low voltage detection reference voltage may be determined based on a Serial Communication Classification Protocol (SCCP) or a power classification of the PD.

The low voltage detection reference voltage may be determined based on the accumulated data in the detected low voltage state.

The predetermined reference time may be determined based on the accumulated data in the detected low voltage state.

The predetermined reference time may be determined according to duration information of the low voltage state among the accumulated data in the detected low voltage state.

Further, in accordance with embodiments of the present disclosure, an operation method of a power sourcing equipment (PSE) for power supply to a powered device (PD) in a power over data lines (PoDL) system for a vehicle network in a vehicle may be provided. The method may comprise measuring an input voltage applied to the PSE; detecting an overvoltage state in which the input voltage is higher than an overvoltage detection reference voltage; determining whether the overvoltage state is a voltage rising state due to a reverse voltage; and entering a detection step when the overvoltage state is not the voltage rising state due to the reverse voltage, and entering a disable step when the overvoltage state is the voltage rising state due to the reverse voltage.

Data in the detected overvoltage state may be accumulated when the overvoltage state is detected.

The data in the detected overvoltage state may include the input voltage applied to the PSE.

The data in the detected overvoltage state may include an input current corresponding to the input voltage applied to the PSE.

The data in the detected overvoltage state may include time information of the vehicle network.

The overvoltage detection reference voltage may be an overvoltage threshold value of a battery installed in the vehicle.

The method may further comprise recording a number of detections of the overvoltage state when the overvoltage state is detected; and determining that a voltage of a battery installed in the vehicle is inadequate when the number of detections of the overvoltage state exceeds a predetermined reference number.

Further, in accordance with embodiments of the present disclosure, an operation method of an apparatus including a physical layer (PHY) block and a power sourcing equipment (PSE) for power supply to a powered device (PD) in a power over data lines (PoDL) system for a vehicle network in a vehicle may be provided. The method may comprise measuring an input voltage applied to the PSE; detecting a low voltage state in which the input voltage is lower than a low voltage detection reference voltage; determining whether the low voltage state is a transient voltage drop state; entering a settle-sleep step when the low voltage state is not the transient voltage drop state, and stopping the power supply between the PSE and the PD while maintaining a link between the PSE and the PD when the low voltage state is the transient voltage drop state, wherein the stopping the power supply include re-measuring the input voltage applied to the PSE after a predetermined reference time elapses; and entering the settle-sleep state when the re-measured input voltage is lower than the low voltage detection reference voltage, and resuming the power supply between the PSE and the PD when the re-measured input voltage is higher than the low voltage detection reference voltage.

According to the power supply methods in the PoDL system according to the present disclosure, the stability of the power supply can be further improved in consideration of the unstable power supply conditions that may occur in the vehicle.

That is, malfunction of the system can be prevented by detecting an input voltage that comes as a reverse voltage through, for example, a cigar jack terminal in the vehicle.

Moreover, it is possible to prevent a link disconnection under a transient input voltage drop due to reasons such as ignition, etc., so that power can be supplied without delay due to time required for setting up re-supply after interruption of power supply.

BRIEF DESCRIPTION OF DRAWINGS

Embodiments of the present disclosure will become more apparent by describing in detail forms of the present disclosure with reference to the accompanying drawings, in which.

Figure 1:
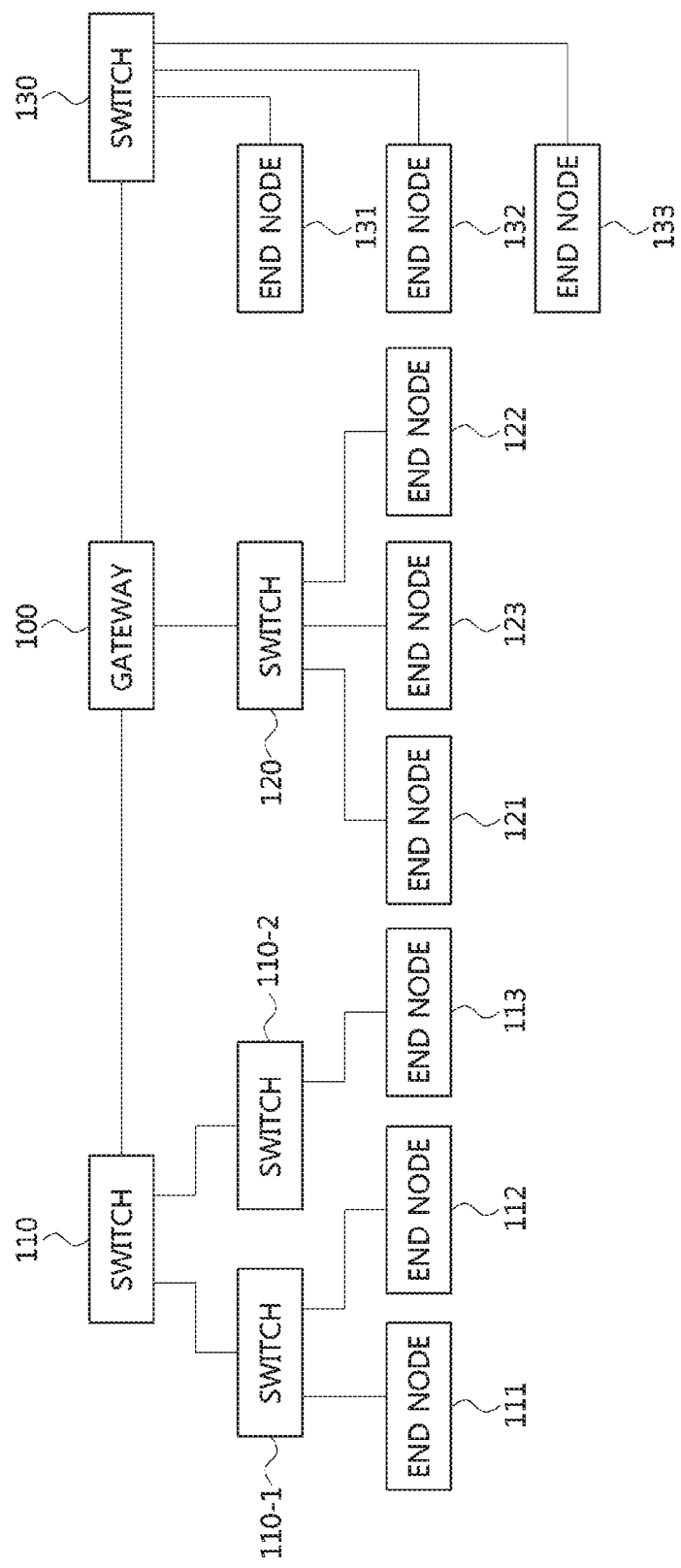
FIG. 1 is a diagram showing a vehicle network topology according to embodiments of the present disclosure.

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION

Hereinafter, embodiments of the present disclosure will be described in detail with reference to the accompanying drawings. As those skilled in the art would realize, the described embodiments may be modified in various different ways, all without departing from the spirit or scope of the present disclosure. Further, throughout the specification, like reference numerals refer to like elements.

The terminology used herein is for the purpose of describing particular forms only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

Although forms are described herein as using a plurality of units to perform the exemplary process, it is understood that the exemplary processes may also be performed by one or plurality of modules. Additionally, it is understood that a controller/control unit may perform one or more of the processes described further below, and the term controller/control unit refers to a hardware device that includes a memory and a processor. The memory is configured to store the modules, and the processor is specifically configured to execute said modules to perform one or more processes which are described further below. Moreover, it is understood that the units or modules described herein may embody a controller/control unit for controlling operation of the unit or module.

Furthermore, control logic of the present disclosure may be embodied as non-transitory computer readable media on a computer readable medium containing executable program instructions executed by a processor, controller/control unit or the like. Examples of the computer readable mediums include, but are not limited to, read-only memory (ROM), random access memory (RAM), compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

Since the present disclosure may be variously modified and have several forms, specific embodiments will be shown in the accompanying drawings and be described in detail in the detailed description. It should be understood, however, that it is not intended to limit the present disclosure to the specific embodiments but, on the contrary, the present disclosure is to cover all modifications and alternatives falling within the spirit and scope of the present disclosure.

Relational terms such as first, second, and the like may be used for describing various elements, but the elements should not be limited by the terms. These terms are only used to distinguish one element from another. For example, a first component may be named a second component without being departed from the scope of the present disclosure and the second component may also be similarly named the first component. The term "and/or" means any one or a combination of a plurality of related and described items.

When it is mentioned that a certain component is "coupled with" or "connected with" another component, it should be understood that the certain component is directly "coupled with" or "connected with" to the other component or a further component may be located therebetween. In contrast, when it is mentioned that a certain component is "directly coupled with" or "directly connected with" another component, it will be understood that a further component is not located therebetween.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Unless otherwise defined, all terms (including technical and scientific terms) used herein have the same meaning as commonly understood by one of ordinary skill in the art to which this disclosure belongs. Terms such as terms that are generally used and have been in dictionaries should be construed as having meanings matched with contextual meanings in the art. In this description, unless defined clearly, terms are not ideally, excessively construed as formal meanings.

Hereinafter, forms of the present disclosure will be described in detail with reference to the accompanying drawings. In describing the disclosure, to facilitate the entire understanding of the disclosure, like numbers refer to like elements throughout the description of the figures and the repetitive description thereof will be omitted.

FIG. 1 is a diagram showing a vehicle network topology according to embodiments of the present disclosure.

As shown in FIG. 1, a communication node included in the vehicle network may be a gateway, a switch (or bridge), or an end node. The gateway 100 may be connected with at least one switch 110, 110-1, 110-2, 120, and 130 and may be configured to connect different networks. For example, the gateway 100 may support connection between a switch which supports a controller area network (CAN) (e.g., FlexRay, media oriented system transport (MOST), or local interconnect network (LIN)) protocol and a switch which supports an Ethernet protocol. Each of the switches 110, 110-1, 110-2, 120, and 130 may be connected to at least one of end nodes 111, 112, 113, 121, 122, 123, 131, 132, and 133. Each of the switches 110, 110-1, 110-2, 120, and 130 may interconnect the end nodes 111, 112, 113, 121, 122, 123, 131, 132, and 133, and control at least one of end nodes 111, 112, 113, 121, 122, 123, 131, 132, and 133 connected to the switch.

The end nodes 111, 112, 113, 121, 122, 123, 131, 132, and 133 may include an electronic control unit (ECU) configured to control various types of devices mounted within a vehicle. For example, the end nodes 111, 112, 113, 121, 122, 123, 131, 132, and 133 may include the ECU included in an infotainment device (e.g., a display device, a navigation device, and an around view monitoring device).

The communication nodes (e.g., a gateway, a switch, an end node, or the like) included in the vehicle network may be connected in a star topology, a bus topology, a ring topology, a tree topology, a mesh topology, or the like. In addition, the communication nodes of the vehicle network may support the CAN protocol, the FlexRay protocol, the MOST protocol, the LIN protocol, or the Ethernet protocol. Embodiments of the present disclosure may be applied to the foregoing network topologies. The network topology to which forms of the present disclosure may be applied is not limited thereto and may be configured in various ways.

Figure 2:
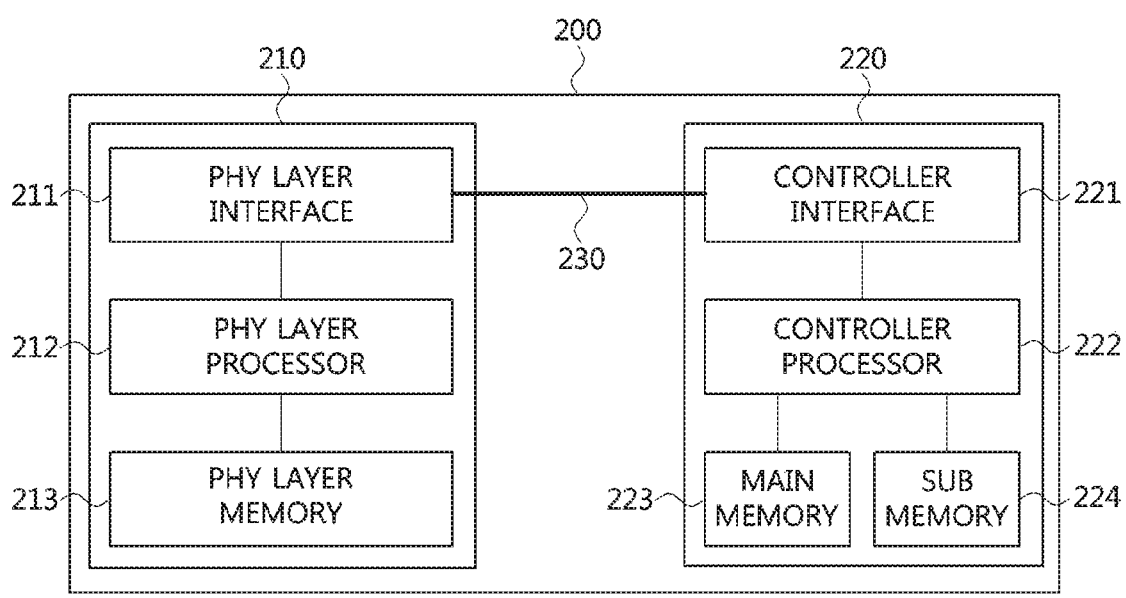
FIG. 2 is a diagram showing a communication node constituting a vehicle network according to embodiments of the present disclosure.

FIG. 2 is a diagram showing a communication node constituting a vehicle network according to embodiments of the present disclosure. Notably, the various methods discussed below may be executed by a controller having a processor and a memory.

As shown in FIG. 2, a communication node 200 of a network may include a PHY layer 210 and a controller 220. In addition, the communication node 200 may further include a regulator (not shown) for supplying power. In particular, the controller 220 may be implemented to include a medium access control (MAC) layer. A PHY layer 210 may be configured to receive or transmit signals from or to another communication node. The controller 220 may be configured to control the PHY layer 210 and perform various functions (e.g., an infotainment function, or the like.). The PHY layer 210 and the controller 220 may be implemented as one system on chip (SoC), or alternatively may be implemented as separate chips.

Furthermore, the PHY layer 210 and the controller 220 may be connected via a media independent interface (MII) 230. The MII 230 may include an interface defined in the IEEE 802.3 and may include a data interface and a management interface between the PHY layer 210 and the controller 220. One of a reduced MII (RMII), a gigabit MII (GMII), a reduced GMII (RGMII), a serial GMII (SGMII), a 10 GMII (XGMII) may be used instead of the MII 230. A data interface may include a transmission channel and a reception channel, each of which may have an independent clock, data, and a control signal. The management interface may include a two-signal interface, one signal for the clock and one signal for the data.

Particularly, the PHY layer 210 may include a PHY layer interface 211, a PHY layer processor 212, and a PHY layer memory 213. The configuration of the PHY layer 210 is not limited thereto, and the PHY layer 210 may be configured in various ways. The PHY layer interface 211 may be configured to transmit a signal received from the controller 220 to the PHY layer processor 212 and transmit a signal received from the PHY layer processor 212 to the controller 220. The PHY layer processor 212 may be configured to execute operations of the PHY layer interface 211 and the PHY layer memory 213. The PHY layer processor 212 may be configured to modulate a signal to be transmitted or demodulate a received signal. The PHY layer processor 212 may be configured to control the PHY layer memory 213 to input or output a signal. The PHY layer memory 213 may be configured to store the received signal and output the stored signal based on a request from the PHY layer processor 212.

The controller 220 may be configured to monitor and control the PHY layer 210 using the MII 230. The controller 220 may include a controller interface 221, a controller processor 222, a main memory 223, and a sub memory 224. The configuration of the controller 220 is not limited thereto, and the controller 220 may be configured in various ways. The controller interface 221 may be configured to receive a signal from the PHY layer 210 (e.g., the PHY layer interface 211) or an upper layer (not shown), transmit the received signal to the controller processor 222, and transmit the signal received from the controller processor 222 to the PHY layer 210 or the upper layer. The controller processor 222 may further include independent memory control logic or integrated memory control logic for controlling the controller interface 221, the main memory 223, and the sub memory 224. The memory control logic may be implemented to be included in the main memory 223 and the sub memory 224 or may be implemented to be included in the controller processor 222.

Furthermore, each of the main memory 223 and the sub memory 224 may be configured to store a signal processed by the controller processor 222 and may be configured to output the stored signal based on a request from the controller processor 222. The main memory 223 may be a volatile memory (e.g., RAM) configured to temporarily store data required for the operation of the controller processor 222. The sub memory 224 may be a non-volatile memory in which an operating system code (e.g., a kernel and a device driver) and an application program code for performing a function of the controller 220 may be stored. A flash memory having a high processing speed, a hard disc drive (HDD), or a compact disc-read only memory (CD-ROM) for large capacity data storage may be used as the non-volatile memory. Typically, the controller processor 222 may include a logic circuit having at least one processing core. A core of an Advanced RISC Machines (ARM) family or a core of an Atom family may be used as the controller processor 222.

A method performed by a communication node and a corresponding counterpart communication node in a vehicle network will be described below. Although the method (e.g., signal transmission or reception) performed by a first communication node, the method is applicable to a second communication node that corresponds to the first communication node. In other words, when an operation of the first communication node is described, the second communication node corresponding thereto may be configured to perform an operation that corresponds to the operation of the first communication node. Additionally, when an operation of the second communication node is described, the first communication node may be configured to perform an operation that corresponds to an operation of a switch.

Figure 3:
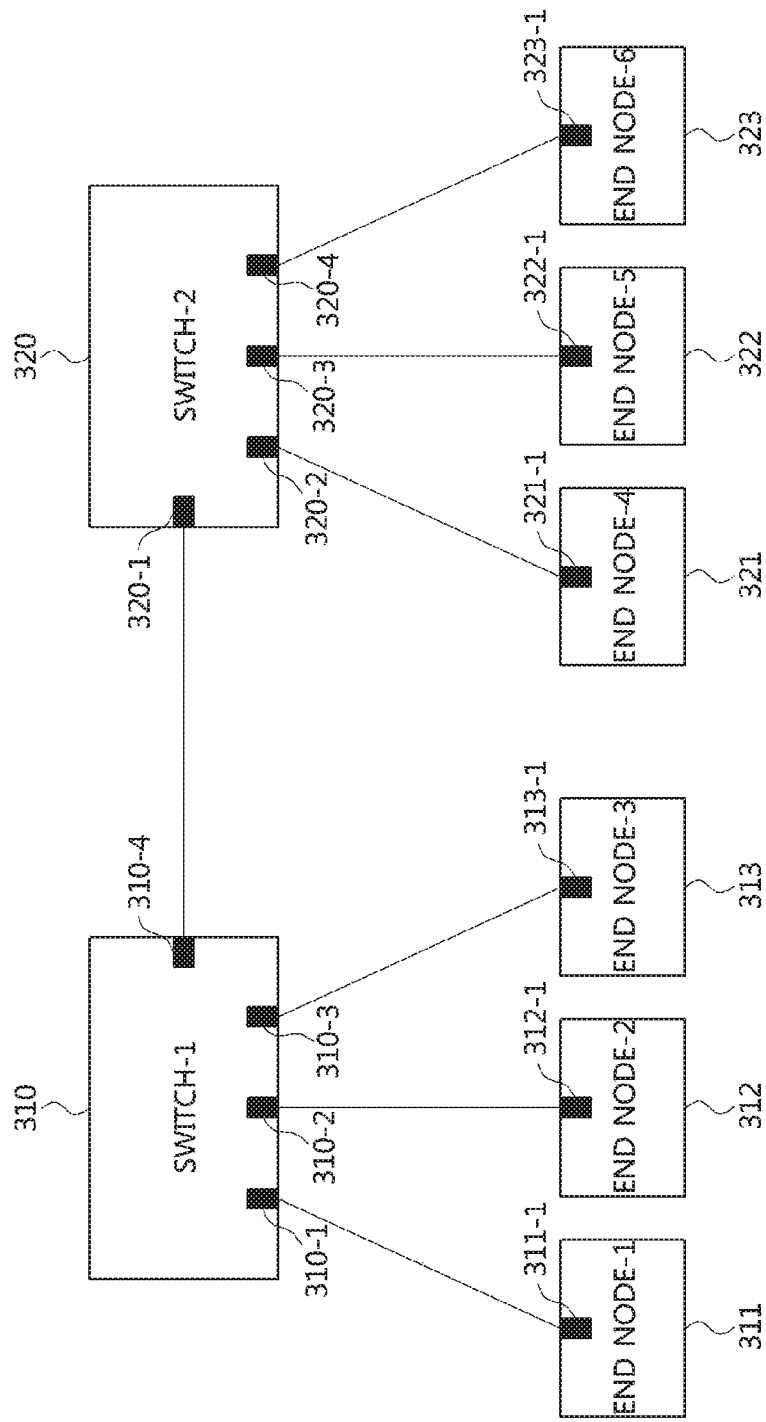
FIG. 3 is a diagram showing another vehicle network topology according to embodiments of the present disclosure.

FIG. 3 is a diagram showing another vehicle network topology according to embodiments of the present disclosure.

As shown in FIG. 3, a vehicle network topology may comprise a plurality of switches 310 and 320, and end nodes 311, 312, 313, 321, 322, and 323 which are respectively connected to the switches 310 and 320. Each of the switches 310 and 320, and the end nodes 311, 312, 313, 321, 322, and 333 may have an identical or a similar structure to that of the communication node 200 described referring to FIG. 2.

A first switch 310 may comprise a plurality of ports 310-1, 310-2, 310-3, and 310-4. A first port 310-1 of the first switch 310 may be connected to a first port 311-1 of a first end node 311, and a link may be formed between the port 310-1 and the port 311-1. A second port 310-2 of the first switch 310 may be connected to a first port 312-2 of a second end node 312, and a link may be formed between the port 310-2 and the port 312-1. A third port 310-3 of the first switch 310 may be connected to a first port 313-1 of a third end node 313, and a link may be formed between the port 310-3 and the port 313-1. A fourth port 310-4 of the first switch 310 may be connected to a first port 320-1 of a second switch 320, and a link may be formed between the port 310-4 and the port 320-1.

The second switch 320 may comprise a plurality of ports 320-1, 320-2, 320-3, and 320-4. A second port 320-2 of the second switch 320 may be connected to a first port 321-1 of a fourth end node 321, and a link may be formed between the port 320-2 and the port 321-1. A third port 320-3 of the second switch 320 may be connected to a first port 322-1 of a fifth end node 322, and a link may be formed between the port 320-3 and the port 322-1. A fourth port 320-4 of the second switch 320 may be connected to a first port 323-1 of a sixth end node 323, and a link may be formed between the port 320-4 and the port 323-1.

Hereinafter, a method for time synchronization among communication nodes, a method for calculating link delay time between communication nodes, and a method for verifying time synchronization among communication nodes will be described based on the vehicle network illustrated in FIG. 3.

Figure 4:
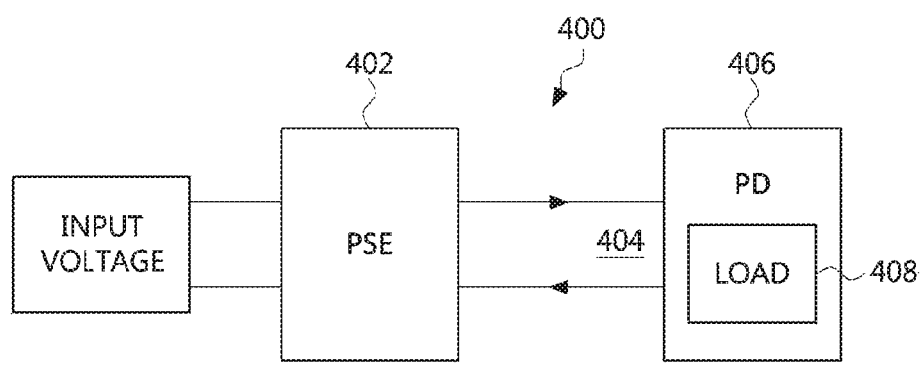
FIG. 4 is a block diagram of a power over data line (PoDL) system.

FIG. 4 is a block diagram of a power over data line (PoDL) system.

The power over data line (PoDL) system is a power supply system using Ethernet. As described above, the Ethernet has become a commonly used computer networking technology since the 1980s and is becoming popular in automotive fields as well. Although the Ethernet was initially used only for diagnostic applications and intelligent charging of electric vehicles, in-vehicle Ethernet networks are also being implemented.

It is known to transmit power over data lines to remotely power equipment. The PoDL is an example of such systems. The PoDL is a framework for transferring power from a power sourcing equipment (PSE) to a powered device (PD) via Ethernet wiring. Various types of the PDs may exist, including, for example, network cameras, computing devices, wireless LAN access points, Bluetooth access points, and the like.

Unlike power over the Ethernet (PoE), the PoDL requires only a single pair of wires. Particularly, it is an attracting feature for a technology to realize main functions such as infotainment, lane departure warning, parking assistance, and telematics in the field of vehicles.

In a PoDL process, detection of valid (PoDL-compatible) devices (PoDL devices) may be performed first. This detection process may be a process for identifying whether a valid PoDL device is connected so that power transmission to non-PoDL-enabled devices is not initiated.

After a valid PD is found, the PSE may optionally perform power classification. Completion of the power classification process may allow the PSE to properly manage powers delivered to the various PDs connected to the PSE.

Management of the connected PDs is one of the functions of the PSE. Generally, the PSE is designed to provide stable power to the PD. One example of the PD is a computing device (e.g., a device controlled by a laptop computer or other software).

The device may have power requirements that vary depending on operations of their internal components. The power requirements of each of these internal components may not be the same and may vary depending on a manufacturer or a supplier.

Moreover, power usage may be highly dependent not only on peripheral devices added to the computing device but also on the application(s) running on the computing device.

The PoDL system may transmit power from the PSE to the PD located on the opposite side of the link through unshielded twisted-pair (UTP) wiring.

The conventional network devices such as conventional IP phones, wireless LAN access points, personal computers and web cameras require two connections. For example, one may be a connection to a local area network (LAN) and the other may be a connection to an electrical alternating current (AC) network. However, in the PoDL system, since power is supplied through the Ethernet wire used for data transmission, only one connection is required.

The main function of the PSE is to search for a link for power request of a PD. Additionally, it is possible for the PSE to identify a power class of the PD, to supply power to the PD through the link when the PD is sensed, to monitor the power of the link, and to reduce the power to a level of a detection level when the power is no longer requested or required.

The PSE and PD are non-data entities that allow network devices to supply and draw power using the same generic wiring used for data transmission. Although the PSE and PD are non-data entities that are not involved in the transmission of Ethernet data, the exchange of information between the PSE and the PD may be performed using a Serial Communication Classification Protocol (SCCP).

The main functions of the PSE may include a function of searching a link to find a PD requesting power, a function of optionally classifying a power class of the PD, a function of supplying power to a link when a PD is detected, a function of monitoring power in a link, and a function of shutting off power when power is no longer requested or required.

The PD may participate in the above-described PD detection procedure by providing a valid or non-valid detection signature for indicating that the PD requests power, or that power has been received. At this time, the PD detection signature may have electrical characteristics which can be measured or detected by the PSE.

Referring to FIG. 4, a PSE 402 may provide DC power to a PD 406 having a predetermined electrical load 408 via a conductor pair 404. The PSE 402 and PD 406 may also include data transceivers that operate in accordance with known communication standards, e.g., an IEEE Ethernet standard.

More specifically, the PSE 402 may include a physical layer (PHY) block on the PSE side, which transmits and receives data to and from a corresponding PHY device in the PD 106. Power transmission and data exchange between the PSE 402 and the PD 406 may be performed through the conductor pair 404.

For example, the PSE 402 may be a data switch having a plurality of ports communicating with one or more PD devices, such as internet telephones or wireless access points.

The conductor pair 404 may transmit a differential data communication signal. For example, the conductor pair 404 may comprise a twisted wire pair, or may include other types of cables or communication media which may carry data transmission signals and DC power between the PSE and the PD.

In the present specification, the conductor pair 404 may also be referred to an Ethernet cable or a link for convenience of explanation.

Figure 5:
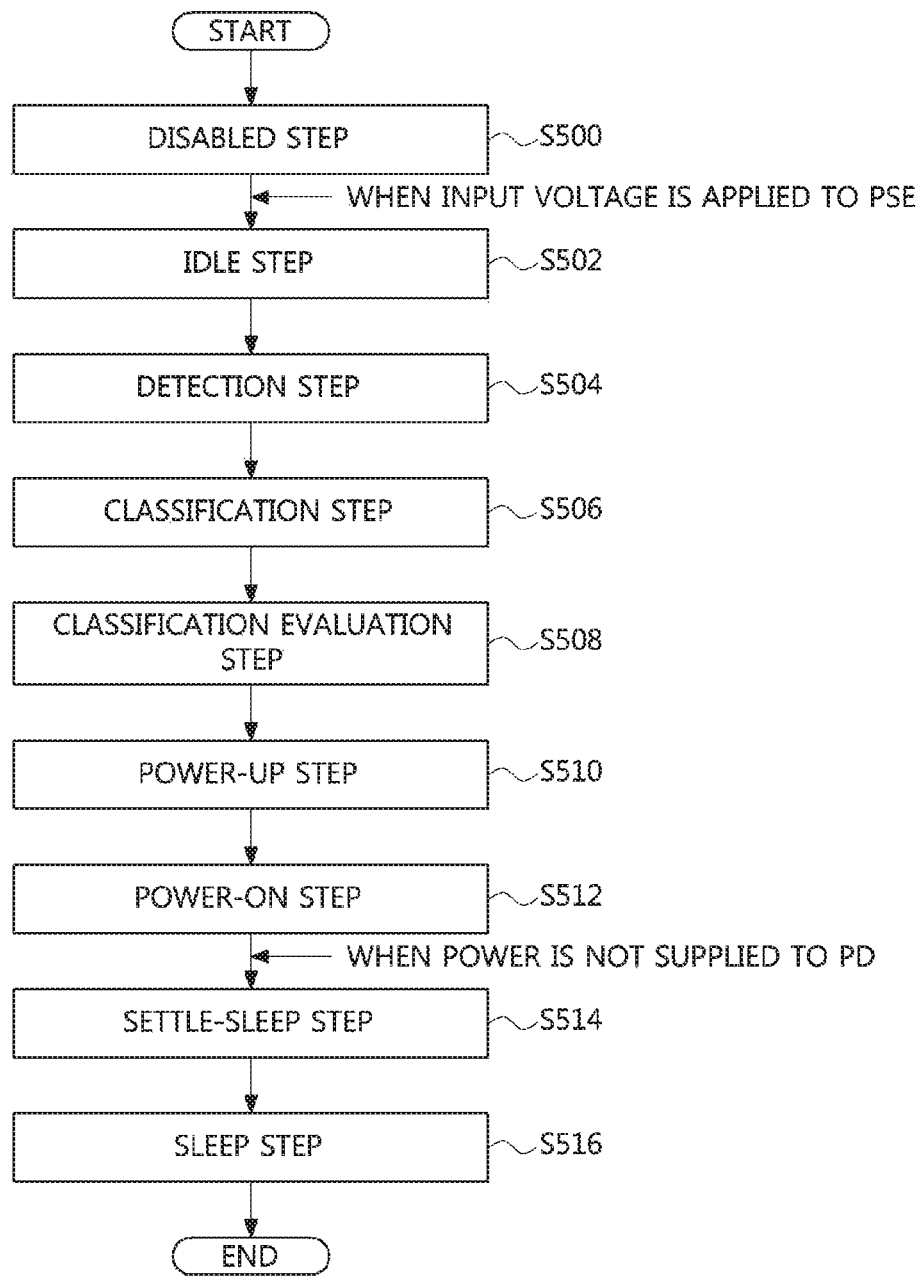
FIG. 5 is a flow chart illustrating an operation method of a power sourcing equipment (PSE) for supplying power in a PoDL system.

FIG. 5 is a flow chart illustrating an operation method of a PSE for supplying power in a PoDL system.

Referring to FIG. 5, when an input voltage is applied in a disabled step S500, the PSE may be transitioned into an idle step S502. Also, once a PD has been connected to or is connected to the PoDL system, the PSE may be generally configured to perform a detection step S504, a classification step S506, a classification evaluation step S508, a power-up step S510, a power-on step S512, a settle-sleep step S514, and a sleep step S516. Here, if the PSE senses a PD in the sleep step S516, the PSE may return to the detection step S504.

For the PSE, the power supply procedure in the PoDL system may be described as follows.

In order to sense and supply power to devices supporting PoDL, a PSE power sourcing may be required to recognize and distinguish PoDL and non-PoDL devices.

In this case, the PDs, which are not PoDL-compatible and which do not need to be powered or are not powered, may be disabled. In addition, this can prevent failures of PoDL-incompatible devices due to obvious safety concerns.

For safe and reliable operation of the PoDL system, the PSE may be forced to determine whether to power the PD by applying a test voltage. The test voltage may be used to determine the load characteristics of the PD. The load characteristics of the PD may determine whether or not the PD is detected. The load characteristics of the PD may be referred to as the PD detection signature.

The PSE may determine whether to supply power and how much power to supply by reading the PD detection signature. A failure to read the signature by the PSE may result in no power supply from the network to that particular PD.

Important functions of the PSE may be to detect the PD that is enabled to be powered on, provide the required class of power, and disconnect the power supply if the PD is disconnected from the link. Such the detection mechanism is a critical function of the PSE and makes it possible for the PSE to prevent unnecessary power supplies to various PDs.

1. Detection

At the start, the PSE may output a very small voltage (with a current less than 10 mA) on each port until the PSE detects that a cable end of the PSE is connected to a PD supporting PoDL.

2. Classification of PD

When a PD is detected, the PSE may classify the PD and evaluate power consumption of the PD. Here, the classification may be performed by using a Serial Communication Classification Protocol (SCCP). Exceptionally, the execution of the SCCP may be omitted, for example, for PDs which are fixedly mounted like PDs in a fixed network for a vehicle. This case may be referred to as a 'fast startup mode'.

3. Power Increment

During a start-up time with configurable duration, the PSE may start at a lower voltage in order to supply a normal operating voltage (e.g., 48V DC voltage) to the PD.

4. Operation

The PSE may provide a stable and reliable DC voltage (e.g., 12V, 24V, 48V, etc.) to the PD to satisfy the power consumption of the PD. The PSE can deliver up to 50 W of power in the PoDL system.

5. Power Decrement

When the PD is physically or electrically transferred out of the network, the PSE may quickly terminate the power supply to the PD, and may start a detection procedure for detecting whether or not a PD connected to the end of the cable exists.

According to the above description, if the PD does not have an external power source, the PSE may power the PD until the PD is physically or electrically transferred out of the network.

Figure 6:
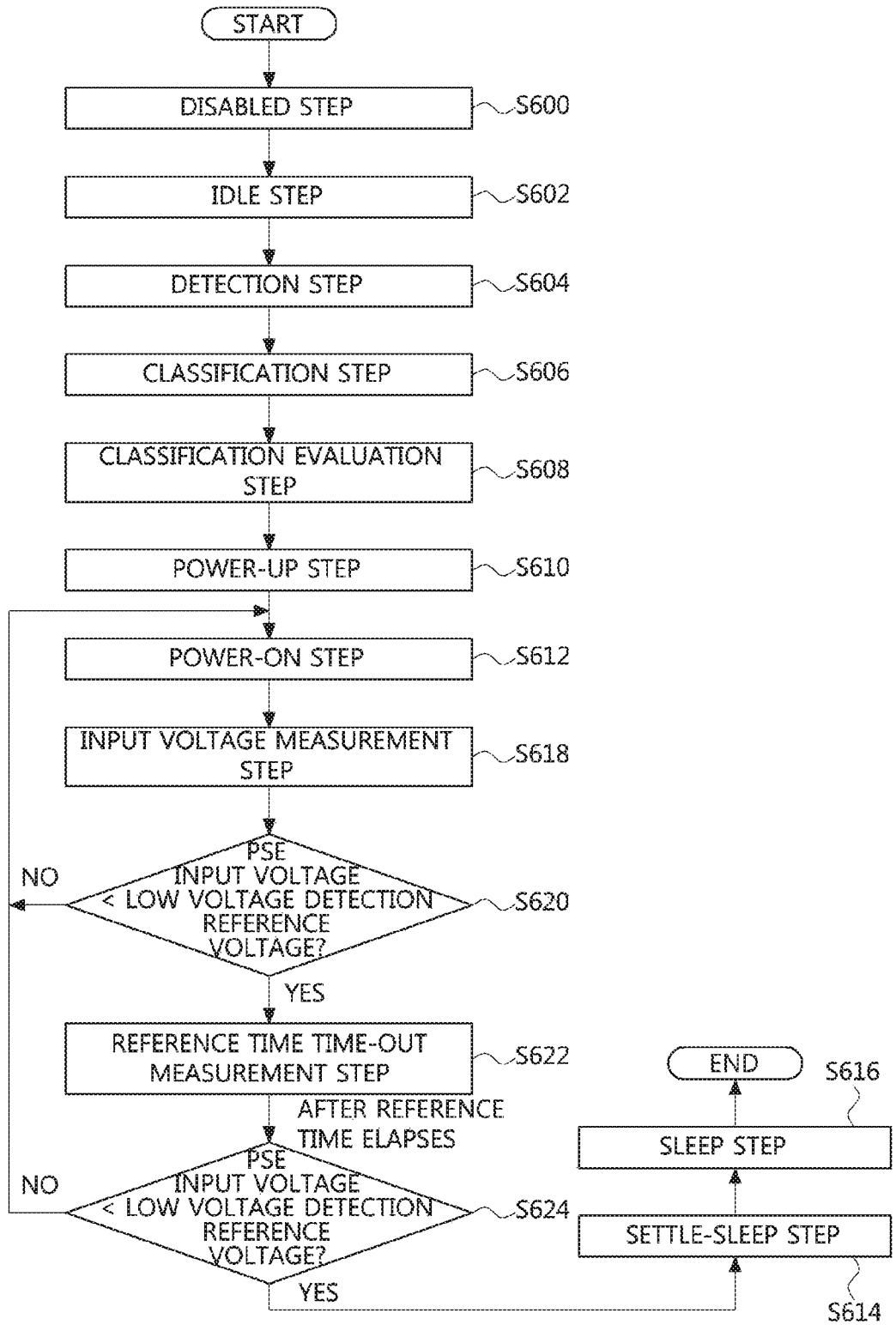
FIG. 6 is a flow chart explaining an operation method of a PSE including a transient low voltage detection step in a PoDL system according to the present disclosure.

FIG. 6 is a flow chart explaining an operation method of a PSE including a transient low voltage detection step in a PoDL system according to the present disclosure.

Referring to FIG. 6, an input voltage measurement step S618 for detecting a low voltage may be added before entering a settle-sleep step S614 from a power-on step S612.

In a step S620, it may be possible to confirm whether or not the input voltage to the PSE is lower than a low voltage detection reference voltage.

Here, the low voltage detection reference voltage may be determined according to information on an operation voltage of a battery installed in the vehicle, the SCCP, or the power classification of the PD.

For example, the voltage supplied to the PD may be classified as about 12V or the like using the SCCP. Alternatively, if the voltage to be supplied to the PD is already identified as about 12 V or the like without using the SCCP, the low voltage detection reference voltage may be determined based on the classified voltage (about 12V, 24V, 48V, etc.).

In the step S620, if the PSE input voltage is higher than the low voltage detection reference voltage, the PSE may maintain the power-on step S612. If the PSE input voltage is lower than the low voltage detection reference voltage in the step S620, a reference time time-out measurement step S622 may be performed to determine whether a state where the PSE input voltage is lower than the reference voltage is maintained for a predetermined reference time.

In order to determine the reference time, data in accumulated low-voltage states may be used. For example, the data in accumulated low-voltage states may be analyzed according to a predetermined rule, and the analyzed result may be used to determine the reference time.

If the elapsed time of the state, where the PSE input voltage is lower than the low voltage detection reference voltage, exceeds the reference time in the reference time-out measurement step S622, the PSE may enter the settle-sleep step S614.

The reference time time-out measurement step S622 may be a step for measuring the elapsed time of the low voltage state in a state other than the sleep step. That is, in the step S622, the power supply is stopped by lowering the voltage while the link setup is maintained.

After the reference time time-out measurement step S622, an input voltage re-measurement step S624 may be performed. Through the step S624, it may be possible to re-confirm whether or not the input voltage to the PSE is still lower than the low voltage detection reference voltage.

In the input voltage re-measurement step S624, if the PSE input voltage is higher than the low voltage detection reference voltage, the PSE may return to the power-on step S612. If the PSE input voltage is still lower than the low voltage detection reference voltage in the input voltage re-measurement step S624, the PSE may enter the settle-sleep step S614.

Figure 7:
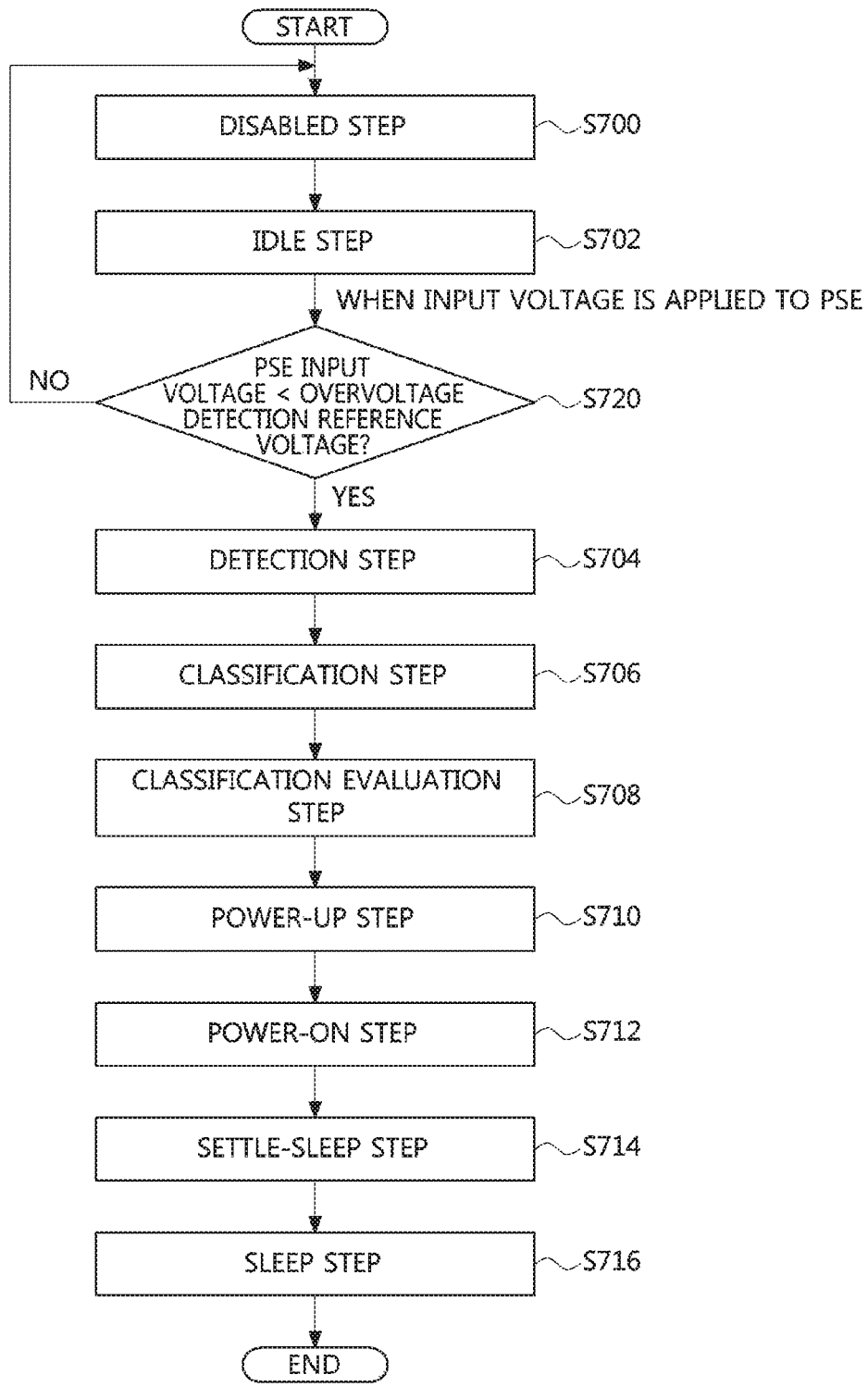
FIG. 7 is a flow chart explaining an operation method of a PSE including an overvoltage detection step in a PoDL system according to the present disclosure.

FIG. 7 is a flow chart explaining an operation method of a PSE including an overvoltage detection step in a PoDL system according to the present disclosure.

Referring to FIG. 7, an overvoltage detection step S720 for detecting an overvoltage state due to a reverse voltage may be performed before entering a detection step S704 from an idle step S702. In the step S720, it may be possible to determine whether the PSE input voltage is higher than an overvoltage detection reference voltage. If the PSE input voltage is higher than the overvoltage detection reference voltage in the overvoltage detection step S720, the PSE may enter a disabled state (S700). However, if the PSE input voltage is lower than the overvoltage detection reference voltage in the overvoltage detection step S720, the PSE may enter the detection step S704.

Figure 8:
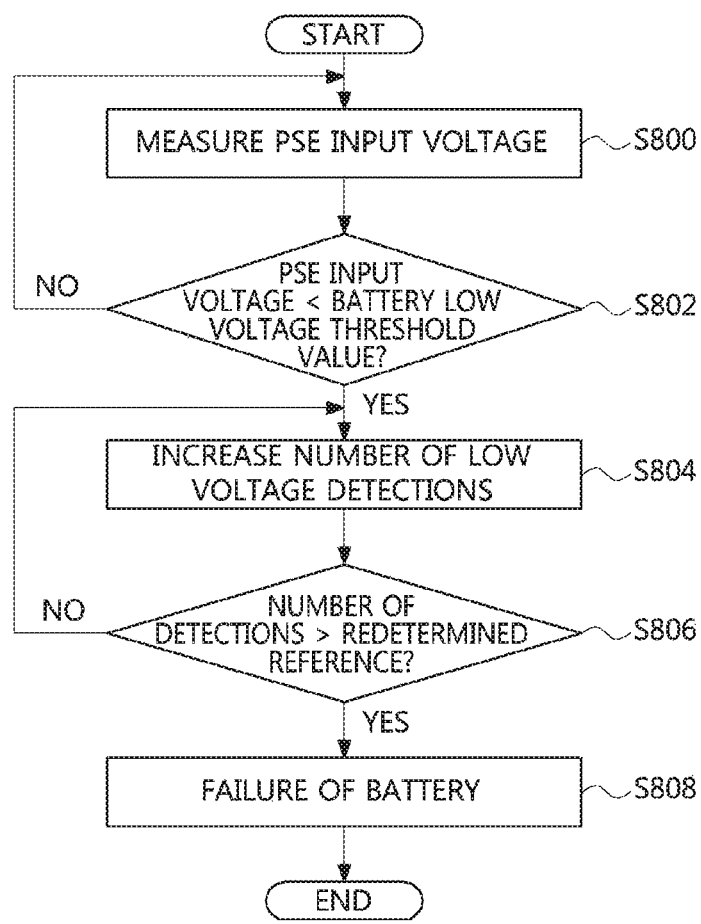
FIG. 8 is a flow chart explaining an operation method of a PSE including a step for determining whether a battery voltage is normal or not based on a battery low voltage threshold value in a PoDL system according to the present disclosure.

FIG. 8 is a flow chart explaining an operation method of a PSE including a step for determining whether a battery voltage is normal or not based on a battery low voltage threshold value in a PoDL system according to the present disclosure.

Referring to FIG. 8, the PSE may determine whether the PSE input voltage is lower than a battery low voltage threshold value in a step S802. If the PSE input voltage is lower than the battery low voltage threshold value, the number of low voltage detections may be accumulated in a step S804.

As shown in FIG. 8, a failure of the battery may be detected by determining that the state of the battery is abnormal when the cumulative number of low voltage detections exceeds a first predetermined reference number (e.g., 5 times).

When the cumulative number of low voltage detections exceeds a second predetermined reference number (e.g. a number higher than the first predetermined reference number), it may be determined that the voltage of the battery installed in the vehicle is inadequate.

On the contrary, if it is determined in the step S802 that the PSE voltage is not lower than the battery low voltage threshold value, the PSE may proceed to a step S800 in order to proceed with the subsequent operation.

Figure 9:
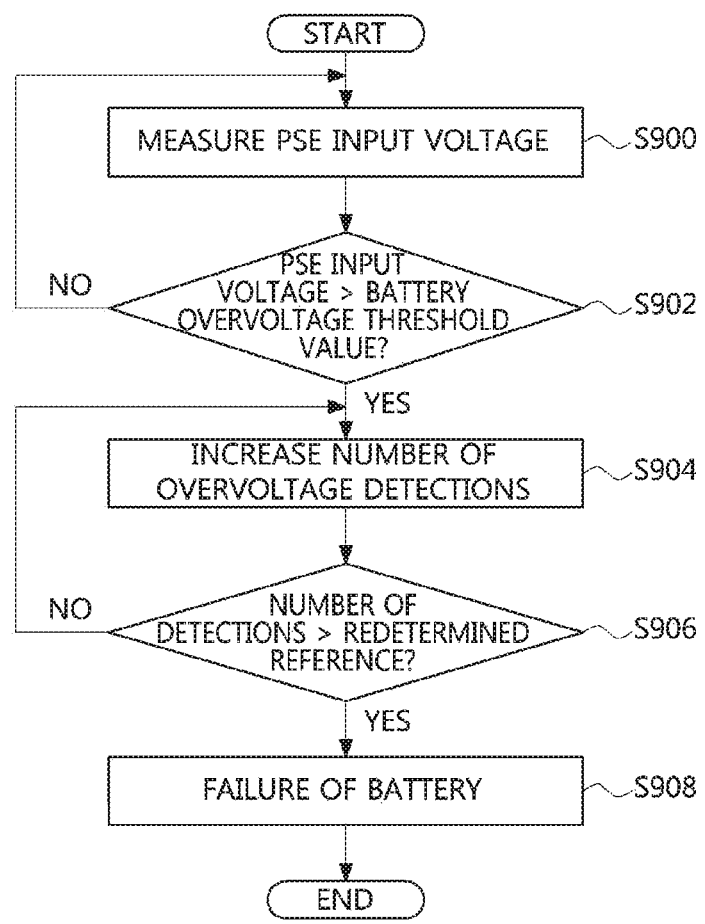
FIG. 9 is a flowchart explaining an operation method of a PSE including a step for determining whether a battery voltage is normal or not based on a battery overvoltage threshold value in a PoDL system according to the present disclosure.

FIG. 9 is a flowchart explaining an operation method of a PSE including a step for determining whether a battery voltage is normal, based on a battery overvoltage threshold value in a PoDL system according to the present disclosure.

Referring to FIG. 9, the PSE may determine whether the PSE input voltage is higher than a battery overvoltage threshold value in a step S902. If the PSE input voltage is higher than the battery overvoltage threshold value, the number of overvoltage detections may be accumulated in a step S904.

As shown in FIG. 9, a failure of the battery may be detected by determining that the state of the battery is abnormal when the cumulative number of overvoltage detections exceeds a first predetermined reference number (e.g., 5 times).

When the cumulative number of overvoltage detections exceeds a second predetermined reference number (e.g. a number higher than the first predetermined reference number), it may be determined that the voltage of the battery installed in the vehicle is inadequate.

On the contrary, if it is determined in the step S902 that the PSE voltage is not higher than the battery overvoltage threshold value, the PSE may proceed to a step S900 in order to proceed with the subsequent operation.

The methods according to forms of the present disclosure may be implemented as program instructions executable by a variety of computers and recorded on a computer readable medium. The computer readable medium may include a program instruction, a data file, a data structure, or a combination thereof. The program instructions recorded on the computer readable medium may be designed and configured specifically for the present disclosure or can be publicly known and available to those who are skilled in the field of computer software. Examples of the computer readable medium may include a hardware device such as ROM, RAM, and flash memory, which are specifically configured to store and execute the program instructions. Examples of the program instructions include machine codes made by, for example, a compiler, as well as high-level language codes executable by a computer, using an interpreter. The above exemplary hardware device can be configured to operate as at least one software module in order to perform the operation of the present disclosure, and vice versa.

While the embodiments of the present disclosure and their advantages have been described in detail above, it should be understood that various changes, substitutions and alterations may be made herein without departing from the scope of the disclosure.

What is claimed is:

1. An operation method of a power sourcing equipment (PSE) for power supply to a powered device (PD) in a power over data lines (PoDL) system for a vehicle network in a vehicle, the method comprising:
    measuring a first input voltage applied to the PSE;
    detecting a low voltage state in which the first input voltage is lower than a low voltage detection reference voltage;
    determining whether an elapsed time of the low voltage state exceeds a predetermined reference time;
    measuring a second input voltage when the elapsed time exceeds the predetermined reference time; and
    entering a settle-sleep step when the second input voltage is lower than the low voltage detection reference voltage, and resuming the power supply between the PSE and the PD when the second input voltage is higher than or equal to the low voltage detection reference voltage,
    wherein the first input voltage is an input voltage applied to the PSE prior to the predetermined reference time, and the second input voltage is an input voltage applied to the PSE after exceeding the predetermined reference time.

2. The operation method according to claim 1, further comprising:
    stopping the power supply between the PSE and the PD while maintaining a link between the PSE and the PD during the predetermined reference time.

3. The operation method according to claim 1, wherein data of the low voltage state is accumulated, when the low voltage state is detected.

4. The operation method according to claim 3, wherein the data in the detected low voltage state includes the first input voltage applied to the PSE.

5. The operation method according to claim 3, wherein the data in the detected low voltage state includes an input current corresponding to the first input voltage applied to the PSE.

6. The operation method according to claim 3, wherein the data in the detected low voltage state includes time information of the vehicle network or duration information of the low voltage state.

7. The operation method according to claim 1, wherein the low voltage detection reference voltage is a low voltage threshold value of a battery installed in the vehicle.

8. The operation method according to claim 1, further comprising:
    recording a number of detections of the low voltage state when the low voltage state is detected; and
    determining that a voltage of a battery installed in the vehicle is inadequate when the number of detections of the low voltage state exceeds a predetermined reference number.

9. The operation method according to claim 1, wherein the low voltage detection reference voltage is determined based on a Serial Communication Classification Protocol (SCCP) or a power classification of the PD.

10. The operation method according to claim 3, wherein the low voltage detection reference voltage is determined based on the data of the low voltage state.

11. The operation method according to claim 2, wherein data in the detected low voltage state is accumulated when the low voltage state is detected, and the predetermined reference time is determined based on the accumulated data in the detected low voltage state.

12. The operation method according to claim 11, wherein the predetermined reference time is determined according to duration information of the low voltage state among the accumulated data in the detected low voltage state.

13. An operation method of a power sourcing equipment (PSE) for power supply to a powered device (PD) in a power over data lines (PoDL) system for a vehicle network in a vehicle, the method comprising:
  measuring an input voltage applied to the PSE;
  detecting an overvoltage state in which the input voltage is higher than an overvoltage detection reference voltage;
  determining whether the overvoltage state is occurred due to an input voltage by the PSE;
  disabling the PSE when the overvoltage state is occurred due to the input voltage by the PSE and recording a number of detections of the overvoltage state when the overvoltage state that is not occurred due to the input voltage by the PSE is detected; and
  determining that a voltage of a battery installed in the vehicle is insufficient when the number of detections of the overvoltage state exceeds a predetermined reference number.

14. The operation method according to claim 13, wherein data in the detected overvoltage state is accumulated when the overvoltage state is detected.

15. The operation method according to claim 14, wherein the data in the detected overvoltage state includes the input voltage applied to the PSE.

16. The operation method according to claim 14, wherein the data in the detected overvoltage state includes an input current corresponding to the input voltage applied to the PSE.

17. The operation method according to claim 14, wherein the data in the detected overvoltage state includes time information of the vehicle network.

18. The operation method according to claim 13, wherein the overvoltage detection reference voltage is an overvoltage threshold value of a battery installed in the vehicle.

19. An operation method of an apparatus including a physical layer (PHY) block and a power sourcing equipment (PSE) for power supply to a powered device (PD) in a power over data lines (PoDL) system for a vehicle network in a vehicle, the method comprising:
  measuring a first input voltage applied to the PSE;
  detecting a low voltage state in which the first input voltage is lower than a low voltage detection reference voltage;
  stopping the power supply between the PSE and the PD while maintaining a link between the PSE and the PD during a predetermined reference time;
  determining whether an elapsed time of the low voltage state exceeds the predetermined reference time;
  measuring a second input voltage when the elapsed time exceeds the predetermined reference time; and
  entering a settle-sleep step when the second input voltage is lower than the low voltage detection reference voltage, and resuming the power supply between the PSE and the PD when the second input voltage is higher than or equal to the low voltage detection reference voltage,
  wherein the first input voltage is an input voltage applied to the PSE prior to the predetermined reference time, and the second input voltage is an input voltage applied to the PSE after exceeding the predetermined reference time.

* * * * *